United States Patent
Katsir et al.

(10) Patent No.: US 7,709,082 B2
(45) Date of Patent: May 4, 2010

(54) ELECTRODES, PRINTING PLATE PRECURSORS AND OTHER ARTICLES INCLUDING MULTI-STRATA POROUS COATINGS, AND METHOD FOR THEIR MANUFACTURE

(75) Inventors: Dina Katsir, Beer Sheva (IL); Iris Tartakovsky, Kiryat Gat (IL); Leonid Bregman, Tel-Aviv (IL)

(73) Assignee: Acktar Ltd., Kiryat Gat (IL)

( * ) Notice: Subject to any disclaimer, the term of this patent is extended or adjusted under 35 U.S.C. 154(b) by 249 days.

(21) Appl. No.: 11/622,601

(22) Filed: Jan. 12, 2007

(65) Prior Publication Data
US 2007/0224410 A1 Sep. 27, 2007

(30) Foreign Application Priority Data
Jan. 12, 2006 (IL) .................................. 173121

(51) Int. Cl.
B32B 3/26 (2006.01)
(52) U.S. Cl. .............. 428/315.9; 428/613; 428/316.6; 428/312.2; 428/314.2; 428/312.8; 428/329; 427/294; 427/248.1; 427/419.1; 427/419.2
(58) Field of Classification Search ............... None
See application file for complete search history.

(56) References Cited

U.S. PATENT DOCUMENTS

| | | | |
|---|---|---|---|
| 4,309,810 | A | 1/1982 | Drake |
| 4,537,665 | A | 8/1985 | Nguyen et al. |
| 4,582,574 | A | 4/1986 | Nguyen et al. |
| 4,970,626 | A | 11/1990 | Kakinoki et al. |
| 5,431,971 | A | 7/1995 | Allegret et al. |
| 5,482,743 | A | 1/1996 | Allegret et al. |
| 5,643,432 | A | 7/1997 | Qiu |

| | | | |
|---|---|---|---|
| 6,287,673 | B1 * | 9/2001 | Katsir et al. ............ 428/210 |
| 6,764,712 | B2 | 7/2004 | Katsir et al. |

(Continued)

FOREIGN PATENT DOCUMENTS

DE 4127743 3/1993

(Continued)

OTHER PUBLICATIONS

Webster's New College Dictionary. 1977, G. & C. Merriam Company, p. 15.*

*Primary Examiner*—Jennifer McNeil
*Assistant Examiner*—Vera Katz
(74) *Attorney, Agent, or Firm*—Stites & Harbison PLLC; Ross F. Hunt, Jr.; Jeffrey A. Heaberlin

(57) ABSTRACT

The invention relates to an article of manufacture which includes a substrate, and on at least one surface thereof, a porous coating which has a total thickness in the range of up to about 50 microns and which consists of a plurality of discrete adjacent strata, wherein each discrete stratum is porous, inclusive of porous interfaces, and is fabricated from at least one substance selected from the group consisting of metals and metal oxides. The article is made by vaporizing a metal under vacuum conditions, optionally in an oxidizing atmosphere, at predetermined intervals of time, such that a deposit of a desired total thickness is formed on the substrate as a coating consisting of a plurality of discrete adjacent strata.

11 Claims, 3 Drawing Sheets

U.S. PATENT DOCUMENTS

| | | | |
|---|---|---|---|
| 6,865,071 B2 | 3/2005 | Katsir et al. | |
| 2001/0051442 A1* | 12/2001 | Katsir et al. | 438/758 |
| 2002/0105080 A1* | 8/2002 | Speakman | 257/749 |
| 2003/0169560 A1* | 9/2003 | Welsch et al. | 361/524 |
| 2004/0084319 A1* | 5/2004 | Cohen | 205/118 |
| 2005/0213325 A1* | 9/2005 | Furneaux et al. | 362/253 |
| 2006/0086273 A1 | 4/2006 | Katsir et al. | |

FOREIGN PATENT DOCUMENTS

WO     WO 02067278 A2 *   8/2002

* cited by examiner

ELECTRODES, PRINTING PLATE PRECURSORS AND OTHER ARTICLES INCLUDING MULTI-STRATA POROUS COATINGS, AND METHOD FOR THEIR MANUFACTURE

FIELD OF THE INVENTION

The present invention relates to articles, such as electrodes (especially electrodes for electrolytic capacitors), membranes and printing plate precursors, which include multi-strata high surface area metal and (or) metal oxide coatings, disposed on a substrate, preferably one of aluminum or aluminum alloy. In a particular aspect, the invention relates to a vacuum evaporation and deposition method of fabricating such articles. Other high surface area applications employing such coatings will suggest themselves to persons of the art.

BACKGROUND OF THE INVENTION

A capacitor is an electronic device which consists of two plates of electrically conductive material separated by an insulator. When introduced in an electrical circuit the plates are connected to a negative and a positive terminal of the current source, and therefore are called cathode and anode respectively.

An electrolytic capacitor is a capacitor in which one plate is metallic and the other plate is an electrolyte. Intervening between the two plates is a dielectric consisting of a surface oxide coating on the metal plate. Conventionally, the metal plate on which the dielectric coating is formed is referred to as the anode. The term "anode" is used herein to refer both to the metal plate itself and to a combination of the metal plate with the dielectric coating. It will be clear from the context which meaning of "anode" is intended. A transition between ionic conduction in the electrolyte and electronic conduction in an external circuit is provided by a second metal plate which is referred to herein as cathode. The anode and the cathode are referred to herein collectively as electrodes. Typically, the anode and the cathode are thin foils.

Typically also, the metal of the anode is a valve metal, i.e. a metal which, when oxidized, allows current to pass if used as cathode but opposes the flow of current when used as anode. Examples of valve metals include magnesium, thorium, cadmium, tungsten, tin, iron, silver, silicon, tantalum, titanium, aluminum, zirconium and niobium.

As is the case with capacitors generally, the capacitance of an electrolytic capacitor is proportional to the surface areas of its two plates. Conventionally, the surface areas of the foils are increased by etching. High purity valve metal foils are etched electrochemically in a chloride solution with DC, AC, or an alteration of DC and AC, or a concurring AC and DC. A disadvantage of electrochemical etching is that in the case of thin foils, it weakens the foil mechanically, making it difficult to fabricate electrolytic capacitors by high speed winding. Furthermore, the electrochemical etching results in acid waste and therefore is not environmentally friendly. Recently, vacuum deposition process has been proposed for increasing the surface areas of foil electrodes.

Kakinoki et al., in U.S. Pat. No. 4,970,626, disclose a method for producing an electrolytic capacitor comprising deposition of titanium onto an aluminum substrate in an atmosphere of argon, wherein the deposition occurs at a constant or gradually varied deposition angle. The disclosed method allows producing a coating with a rough column-like structure deposited onto the substrate, which can be used as a cathode of an electrolytic capacitor. In another embodiment, a two-stage deposition process is employed at different angles at each stage. The disadvantages of the disclosed method of increasing the surface area of a foil electrode include the additional cost of working with two metals and the decrease in stability associated with an intermetallic potential.

U.S. Pat. No. 4,309,810 (Drake) teaches vacuum deposition of a metal vapor, e.g. tantalum, at a low angle onto a foil substrate, e.g. aluminum, so as to produce a column-like structure. The deposition is carried out in presence of oxygen at a partial pressure not exceeding $10^{-4}$ Torr. In an embodiment, a small quantity of an inert gas is added to the oxygen. Drake's foil has been found to be too brittle for use in electrolytic capacitors: it breaks when it is rolled into a cylindrical roll, the standard shape of an electrolytic capacitor. A similar process for producing a column-like surface structure is disclosed in DE 4,127,743 (Neumann et al). Unlike the Drake process the deposition occurs at angles greater than 30°.

Allegret et al., in U.S. Pat. Nos. 5,431,971 and 5,482,743, disclose a process of evaporating aluminum in an oxidizing atmosphere under a pressure of 0.8 to 2.3 Pa, thereby depositing a mixture of aluminum and aluminum oxide. The deposited layer consists of grain agglomerates, forming a porous matrix of aluminum oxide containing metallic aluminum crystallites embedded randomly inside these grains. Such mixed $Al/Al_2O_3$ surfaces are more robust mechanically compared to pure aluminum surfaces; however electrolytic capacitors incorporating them are known to have relatively high resistive losses and relatively low stability over time. In addition, the presence of both aluminum and large quantities of aluminum oxide in the surface of the foil makes difficult and less effective both stabilization by subsequent conventional chemical or electrochemical treatments and structure coarsening by subsequent annealing.

U.S. Pat. No. 6,764,712 (Katsir, et al.) discloses a process for increasing the surface area of a metal substrate, comprising a reactive vacuum vapor deposition of valve metal onto a metal foil in an atmosphere mainly containing oxygen and an inert gas. The process can produce high surface area coatings with a fractal-like structure characterizing by cauliflower-like morphology, which may constitute a component of integrated electrolytic capacitors described in U.S. Pat. No. 6,865,071 (Katsir, et al.)

If the foil is intended to serve as an anode of an electrolytic capacitor, the step of increasing the surface must be followed by a step of oxidizing the surface to produce a thin oxide layer, conventionally by anodization. Patents in this art include U.S. Pat. No. 4,537,665 and U.S. Pat. No. 4,582,574 (Nguyen et al.), and U.S. Pat. No. 5,643,432 (Qiu). For cathode foils, in order to maintain capacity over time, the oxidizing step is necessary, and is also termed stabilizing passivation.

A printing page which comprises a substantially planar substrate and a porous vacuum deposited ungrained coating thereon is described and claimed in U.S. Publication No. 2006-0086273 A1 published on Apr. 27, 2006 (corresponding with the GB priority application No. 0421810.3) which has inventorship in common with the present patent application.

The entire contents of the above-mentioned US patents and published US patent application are incorporated herein by reference.

OBJECTS OF THE INVENTION

It is an object of the present invention to provide an article of manufacture having a high surface area.

It is another object of the present invention to provide a method for making such article of manufacture.

Other objects of the invention will be apparent from the description which follows.

SUMMARY OF THE INVENTION

The present invention thus provides, in one aspect, an article of manufacture which includes: (A) a substrate; and (B) on at least one surface of the substrate, a porous coating which has a total thickness of up to about 50 microns and which consists of a plurality of discrete adjacent strata, wherein each discrete stratum is porous, inclusive of porous interfaces, and is fabricated from at least one substance selected from the group consisting of metals and metal oxides. Preferably, each discrete stratum contains, substantially throughout its breadth, elongate pores forming channels connecting the two opposite faces of the strata, whereby the porosity of the coating extends substantially throughout its breadth and depth.

In another aspect, the invention provides a method for making the article of manufacture of the preceding paragraph, which comprises vaporizing a metal under vacuum conditions, at predetermined intervals of time, such that a deposit is formed on the substrate as a coating consisting a plurality of discrete adjacent strata, the deposition of the coating being terminated when the coating has attained a desired predetermined thickness within the stated range, provided that where the coating is desired to be a metal oxide coating or a mixed metal/metal oxide coating, then the vaporizing is effected in an oxidizing atmosphere, and where the coating is desired to be of metal only the vaporizing is effected in an atmosphere of a gas substantially chemically inert with respect to the vaporized metal.

In still another aspect, the invention provides an article of manufacture which includes: (A) a substrate; and (B) on at least one surface of the substrate, a porous coating which has a total thickness in the range of up to about 50 microns and which consists of a plurality of discrete adjacent strata, wherein each discrete stratum is porous, inclusive of porous interfaces, and contains, substantially throughout its breadth, elongate pores forming channels connecting the two opposite faces of the strata, whereby the porosity of the coating extends substantially throughout its breadth and depth.

DEFINITIONS

Figure 1A:
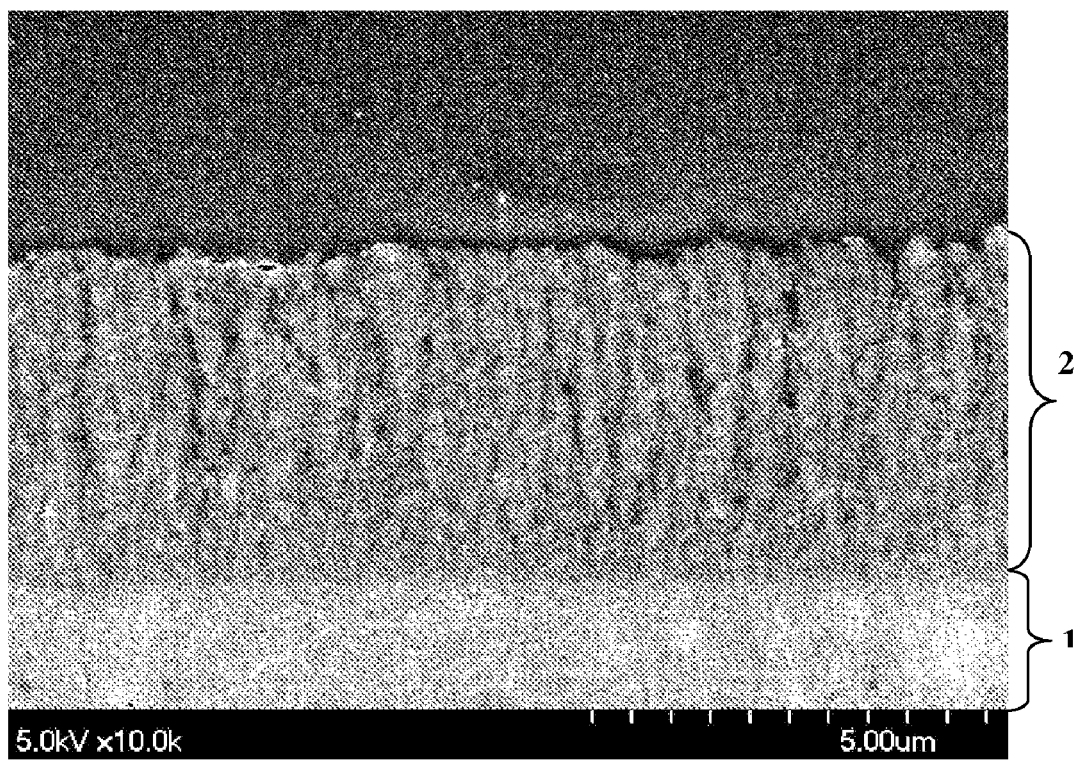
FIG. 1A is a micrograph (cross-sectional view) of single-stratum coating obtained by SEM at magnification 1,000.

A "metal" or "metals" include(s) single metallic elements and admixtures and alloys thereof, unless the context specifically indicates the contrary. A "valve metal" means one (or more than one depending on the context) of the following: magnesium, thorium, cadmium, tungsten, tin, iron, silver, silicon, tantalum, titanium, aluminum, zirconium and niobium.

The term "vacuum deposition" includes all vacuum deposition techniques such as e.g., thermal resistive evaporation, electron beam evaporation, electric arc deposition, laser deposition and sputtering.

The term "coating", unless the context indicates otherwise, means the multi-strata high surface area coating which characterizes the present invention.

DETAILED DESCRIPTION OF THE INVENTION

The article of manufacture of the invention is preferably further characterized by at least one of the following features: (a) the substrate is a metal substrate; (b) the metals are valve metals and the metal oxides are valve metal oxides; (c) it includes additionally a superimposed surface oxide layer; (d) the coating is a vacuum-deposited coating. More preferably, one or more of the following features applies: the metal substrate is selected from the group consisting of aluminum and aluminum alloy substrates, and the valve metal is aluminum; and (or) the metal substrate is a metal foil substrate; and (or) the superimposed surface oxide layer is an anodized layer. Where the substrate is a metal foil substrate (or a similar substrate in which its thickness is considerably less than its length and breadth), it will be apparent that such a substrate may be coated either on one side only, or on both sides.

As indicated above, non-limiting articles of manufacture according to the invention are electrodes adapted for use in capacitors (especially electrolytic capacitors), membranes and lithographic printing plate precursors. Membranes in accordance with the present invention, which may be used e.g. for the separation of mixtures, require a porous substrate.

As regards the method of the invention, it will be apparent that this may be adapted to produce an article of manufacture having one or more of the preferred features mentioned above.

The necessary vaporization of the metal in the inventive method may be achieved in any known manner such as thermal evaporation or electron beam evaporation. Moreover, post-treatments include e.g. annealing and (or) oxidation, the oxidation being preferably effected by anodizing.

In a particular embodiment of the method of the invention, vaporization of metal is effected in an oxidizing atmosphere, and each stratum of the plurality of strata is deposited under substantially identical conditions of temperature and flow rates of the process gases (e.g. oxygen and another gas chemically inert with respect to the vaporized metal).

In a different embodiment of the method, vaporization of metal is effected in an oxidizing atmosphere, and each stratum of the plurality of strata is deposited under conditions of temperature and flow rates of the process gases which are varied from stratum to stratum in a predetermined manner, in order to achieve a desired variation in porosity and (or) pore shape in each stratum.

While the present invention is not to be construed as limited by any theory or explanation, it is presently believed that the higher porosity of the multi-strata coating which characterizes the present invention, is due in turn to its higher absorption/adsorption with respect to the process gases, compared to that of the single-strata coating having the same thickness, and produced in a single stage operation.

When a thin stratum is deposited, and after that, further strata are deposited after intervals of time, which may be predetermined by prior experimentation to afford optimal results in terms of e.g. desired fine structure and/or porosity, the deposited thin strata are capable of adsorbing/absorbing the process gases, thereby producing porous interfaces between adjacent strata. Such interface is characterized by relatively long channel-like pores oriented substantially lengthwise and widthwise with respect to the substrate surface. Each stratum contains relatively short transverse channels (oriented substantially orthogonal to the substrate surface) channels, whereby transverse channels of adjacent strata are connected with each other and with channels at the interface of adjacent strata. When the initial stratum deposition step is repeated at intervals, a quasi-regular structure of the multi-strata coating is produced, which is characterized by a high effective surface area, resulting in e.g. higher capacitance where the article of manufacture is an electrode of a capacitor, e.g. an electrolytic capacitor.

The coating produced stepwise as described above has a higher porosity compared with coating of the same thickness produced by a one-step process carried out under similar conditions, i.e. evaporation rate, oxygen to inert gas flow rate ratio (in the meaning above), etc. As a result, the foil having a multi-strata coating exhibited a higher value of capacitance compared with the corresponding one-stratum coating.

The principles of fabricating multi-strata coatings and use thereof in the manufacture of foil electrodes by the method of present invention may be better understood with reference to the drawings and the accompanying description.

The techniques of vacuum deposition, on which the present invention is based are well-known in the art and need not be detailed here. See, for example, D. M. Mattox, "Vacuum deposition, reactive evaporation and gas evaporation", ASM Handbook, Volume 5: Surface Engineering, 1994, pp. 556-581. Any suitable method may be used to evaporate the metal, for example, thermal resistive evaporation, electron beam evaporation and sputtering.

In the method of the invention, in the case where the multi-strata coating consists of or includes a metal oxide, vaporization is effected in an oxidizing atmosphere, which may be substantially pure oxygen, but is preferably oxygen mixed with an inert gas, i.e. a gas which is substantially chemically inert with respect to the vaporized metal. in the case where the multi-strata coating consists of metal only, vaporization is effected in an atmosphere of inert gas. In either case, the inert gas is preferably argon, but may also be nitrogen if under the conditions in the vaporization chamber, this may react with the vaporized metal (such as Al), and (or) with oxygen if present, only to a minor extent. Under similar circumstances, argon/nitrogen mixtures may also be viable. Moreover, the presence in the vaporization chamber of small amounts of other gases such as water vapor, hydrogen or carbon dioxide, do not appear to adversely affect the method of the invention.

The total thickness of the multi-strata coating, stated above as being up to about 50 microns, is preferably within the range of from about 0.2 to about 30 microns, more preferably from about 0.3 to about 20 microns, most preferably from about 0.5 to about 10 microns. In a particular embodiment, this total thickness falls within the range of about 1 to about 5 microns.

The number of strata in the coating will be at least 2, preferably at least 3, more preferably at least 5 and most preferably at least 10 strata. The upper limit of the number of strata will be determined by the practical thickness of the individual strata, and above all by commercial viability. By way of non-limiting illustration only, a 30 micron coating may consist of 300×0.1 micron strata or 100×0.3 micron strata, or 30×1 micron strata. While it is evident that the total coating thickness, the individual stratum thickness and the number of strata are inter-related parameters, nevertheless it may be stated that the individual strata will usually have a thickness within the range of from about 0.1 to about 1 micron, preferably within the range of from about 0.15 to about 0.5 micron.

DESCRIPTION OF THE PREFERRED EMBODIMENTS

In the method of the invention, a multi-strata high-porosity metal and (or) metal oxide coating is deposited on a substrate by e.g. thermal evaporation in vacuum of the metal followed by deposition of metal/metal oxide onto the substrate. The method of the present invention is a discrete deposition method, i.e. after the first stratum is deposited, the process is interrupted, and thereafter, a second stratum is deposited similarly. The interrupting and depositing steps are repeated until the required thickness/porosity of the coating is achieved.

The invention is further illustrated by the following non-limiting examples.

Example 1

Depositing a Multi-Strata Mixed Aluminum/Alumina Coating

Standard aluminum foil having a thicknesses of 50 μm was annealed for one hour at a temperature of 450-500° C. to remove residual oil and placed in a deposition chamber, from which the air was then evacuated until a vacuum of $2 \times 10^{-4}$ Torr was attained. An aluminum wire intended for evaporation was wound onto a drum and fed to the evaporation boat at a rate of 0.64-0.68 g/min, where it was evaporated by thermal resistive evaporation onto one side of the aluminum foil at a temperature of about 250-270° C., while oxygen in an amount varying between 140 cc/min and 150 cc/min, and argon in an amount varying between 45 cc/min and 50 cc/min (volume flow rates of both gases are referred to standard conditions) were introduced into the chamber. Partial pressures of oxygen varied within the range $(4.5\text{-}5.5) \times 10^{-5}$ Torr, and argon within the range $(4.5\text{-}5.5) \times 10^{-3}$ Torr. Other gases (such as hydrogen, nitrogen, carbon dioxide and water vapor) in an amount, significantly less than the amounts of oxygen and argon, were also present in the chamber. The product, which is a mixture of aluminum and aluminum oxide, was deposited onto the foil at a rate of 600 to 700 Å/sec.

After the first stratum of thickness about 0.23 μm had been applied to one side of the foil, the deposition process was interrupted for about 60 seconds. Thereafter, the foregoing deposition step and the time interval between deposition of successive strata were repeated 12 times, thus producing a porous coating containing 13 strata with a total thickness of about 3 μm.

Example 2

This was carried out similarly to Example 1, with the difference that a coating having 25 strata each of a thickness between 0.10 and 0.15 μm, were applied. Total thickness of the coating was about 3 μm, i.e. similar to that of Example 1.

Example 3 (Comparative)

Depositing a Coating Consisting of a Single Stratum

This was carried out similarly to Example 1, with the difference that a single-stratum coating was applied by a single-stage (without intervals) deposition process. Total thickness of the coating was about 3 μm, i.e. similar to that of Example 1. A micrograph (cross-sectional view) of the product coating obtained by use of a scanning electron microscope is shown on FIG. 1A (magnification 1,000), in which reference numeral 1 is a substrate, and 2 is a single-stratum coating.

Example 4

Depositing a Multi-Strata Aluminum Coating

Standard aluminum foil having a thickness of 50 μm was annealed for one hour at temperature 450-500° C. to remove residual oil and placed in the deposition chamber of the apparatus.

The air was evacuated from the deposition chamber until a vacuum of $2 \times 10^{-4}$ Torr was attained. An aluminum wire intended for evaporation was wound on a drum and fed to the evaporation boat at a rate of 0.64-0.68 g/min, where it was evaporated by thermal resistive evaporation onto one side of the aluminum foil at a temperature of about 250-270° C., while argon in an amount varying between 45 cc/min and 50 cc/min (volume flow rates are referred to standard conditions) was introduced into the chamber. Partial pressure of argon was about $5 \times 10^{-3}$ Torr, while other gases (such as hydrogen, nitrogen, carbon dioxide, oxygen and water vapor) in amounts significantly less than the amount of argon, were also present in the chamber. The product which is a porous aluminum was deposited onto the foil at a rate of 500 to 600 Å/sec.

After the first stratum of thickness about 0.20 μm had been applied to one side of the foil, the deposition process was interrupted for about 60 seconds. Thereafter, the foregoing deposition process and interruption were repeated 14 times, thereby producing a porous coating containing 15 strata with a total thickness of about 3 μm.

Example 5

Depositing a Multi-Strata Alumina Coating

Standard aluminum foil having a thickness of 50 μm was annealed for one hour at temperature 450-500° C. to remove residual oil and placed in the deposition chamber of the apparatus, from which air was then evacuated until a vacuum of $2 \times 10^{-4}$ Torr was attained. An aluminum wire intended for evaporation was wound onto a drum and fed to the evaporation boat at a rate of 0.64-0.68 g/min, where it was evaporated by thermal resistive evaporation onto one side of the aluminum foil at a temperature of about 250-270° C., while oxygen in an amount varying between 320 cc/min and 340 cc/min, and argon in an amount varying between 45 cc/min and 50 cc/min (volume flow rates of both gases are referred to standard conditions) were introduced into the chamber. Partial pressures of oxygen varied within the range $(6.0\text{-}8.0) \times 10^{-4}$ Torr and argon within the range $(4.0\text{-}4.5) \times 10^{-3}$ Torr. Other gases (such as hydrogen, nitrogen, carbon dioxide and water vapor) in an amount, significantly less than the amounts of oxygen and argon, were also present in the chamber. The product which is a porous alumina was deposited onto the foil at a rate of 600 to 750 Å/sec.

After the first stratum of thickness about 0.20 μm had been applied from one side of the foil, the deposition process was interrupted for about 60 seconds. Thereafter the foregoing deposition process and the interruption were repeated 14 times, thereby producing a porous coating containing 15 strata with a total thickness of about 3 μm.

Example 6

Anodizing

All the three foils produced correspondingly by the methods described in Examples 1 to 3 were further subjected to a standard anodizing treatment. The treatment conditions were as follows:

| | |
|---|---|
| Voltage | 0.5 V (direct current) |
| Current density | 5 A/dm$^2$ |
| Duration | 10 min |
| Electrolyte temperature | 83-90° C. |
| Electrolyte: | 150 g/L ammonium adipate aqueous solution. |

Standard Test Method (ASTM Standard E 595-93, 2003) for Total Mass Loss and Collected Volatile Condensable Materials from Outgassing in a Vacuum Environment The two foils produced by the method set forth in Examples 1 and 2, after anodizing, were tested by outgassing in a vacuum environment for total mass loss (TML) and collected volatile condensable materials (CVCM). This test is intended to determine the volatile content of materials (e.g. foams, films, coatings, etc.) when exposed to a vacuum environment. TML is measured ex-situ as a difference of mass before and after exposure to a vacuum under the conditions specified in the outgassing test, while CVCM is measured ex-situ on a collector plate after exposure to the specified vacuum) under the conditions specified, both TML and CVCM being normally expressed as % of initial mass of material.

The result of the test was: TML—5.22%, CVCM 0.01%. This result is evidence of extremely high porosity of the coatings of the invention. To understand better the result it may be noted that other materials having similar values of CVCM are characterized by considerably lower TML values, for example, Lamiglas LG 1047 polyester film—0.09, cellulose acetate butyrate films—about 0.95.

Variation with Depth of the Composition of Exemplary Coatings of the Invention, Compared with a Single-Stratum Coating.

Figure 3:
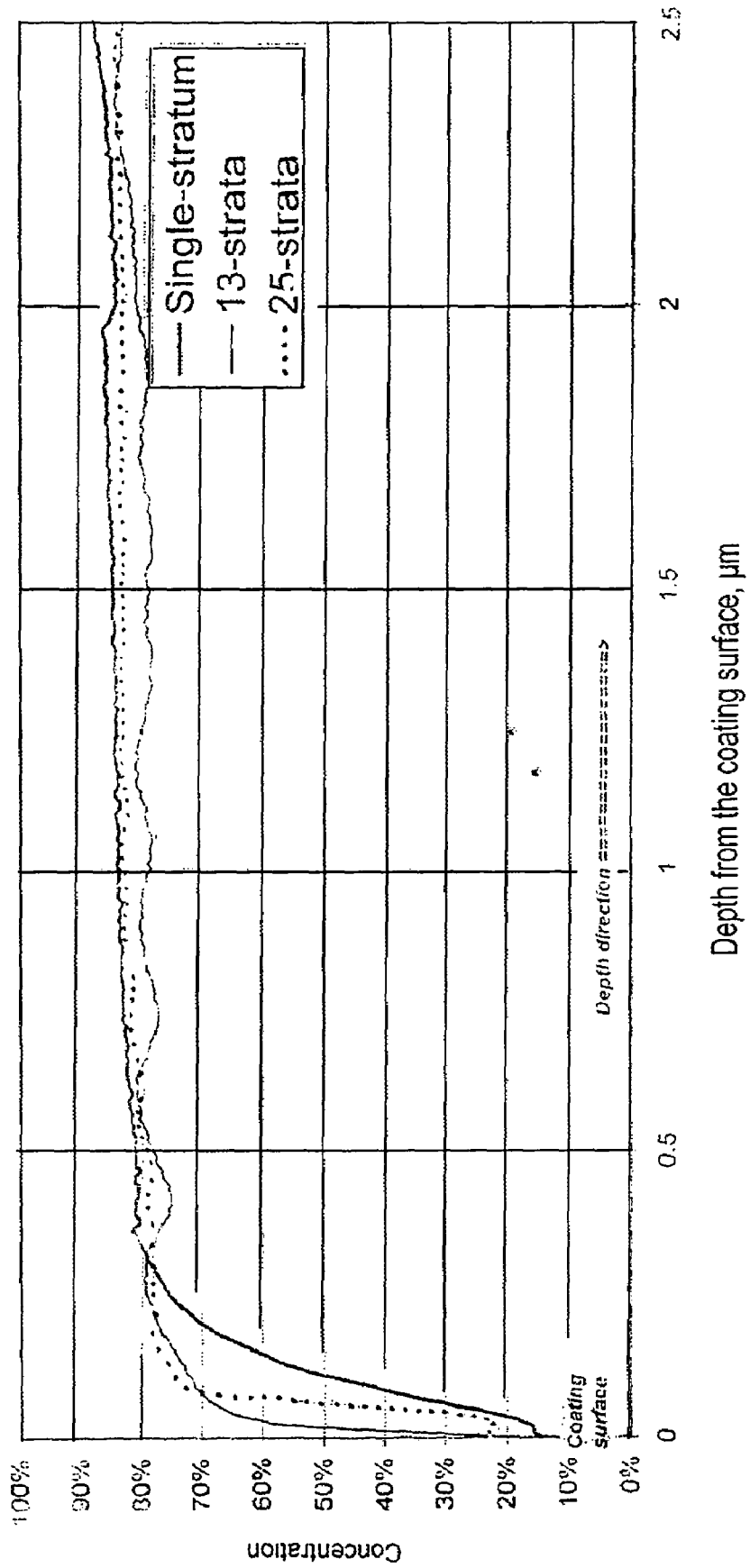
FIG. 3 is a GDS-derived graph showing the variation with depth, of the composition of coatings according to embodiments of the invention, compared with a single-stratum coating.

FIG. 3 is a Glow Discharge Spectroscopy (GDS)-derived graph in which the aluminum wt. % content of three Al/Al$_2$O$_3$ coatings is plotted against coating depth up to 2.5 microns. The three coatings are the 13- and 25-strata coatings of the invention, and a single-stratum coating, all of which have been described above. For this purpose, elements other than Al and O, present in very minor amounts, have been ignored. Plotted data for the surface of the coatings is shown on the left-hand side of the graph.

As shown in FIG. 3, the compositions of the exemplary coatings of the invention show differences from the single stratum coating. For example, in the top 0.5 micron segment, the exemplary coatings have a significantly higher Al content than the single-stratum coating. Also, in the 0.5 to 2.5 micron segment, there appears to be less overall variation in the Al content of the exemplary coatings, than in the single-stratum coating.

Capacitance of Products

Capacitance of the samples produced in accordance with Examples 1-3 and anodized at 0.5V in accordance to Example 6 was measured and is shown (normalized to 1 micron thickness) in the below table.

TABLE

| Type of coating | Number of strata | Capacitance to thickness ratio, $\mu F/cm^2/\mu m$ |
| --- | --- | --- |
| Single-stratum | 1 | 133 |
| Multi-strata | 13 | 160 |
| Multi-strata | 25 | 183 |

Discussion of Results

Figure 1B:
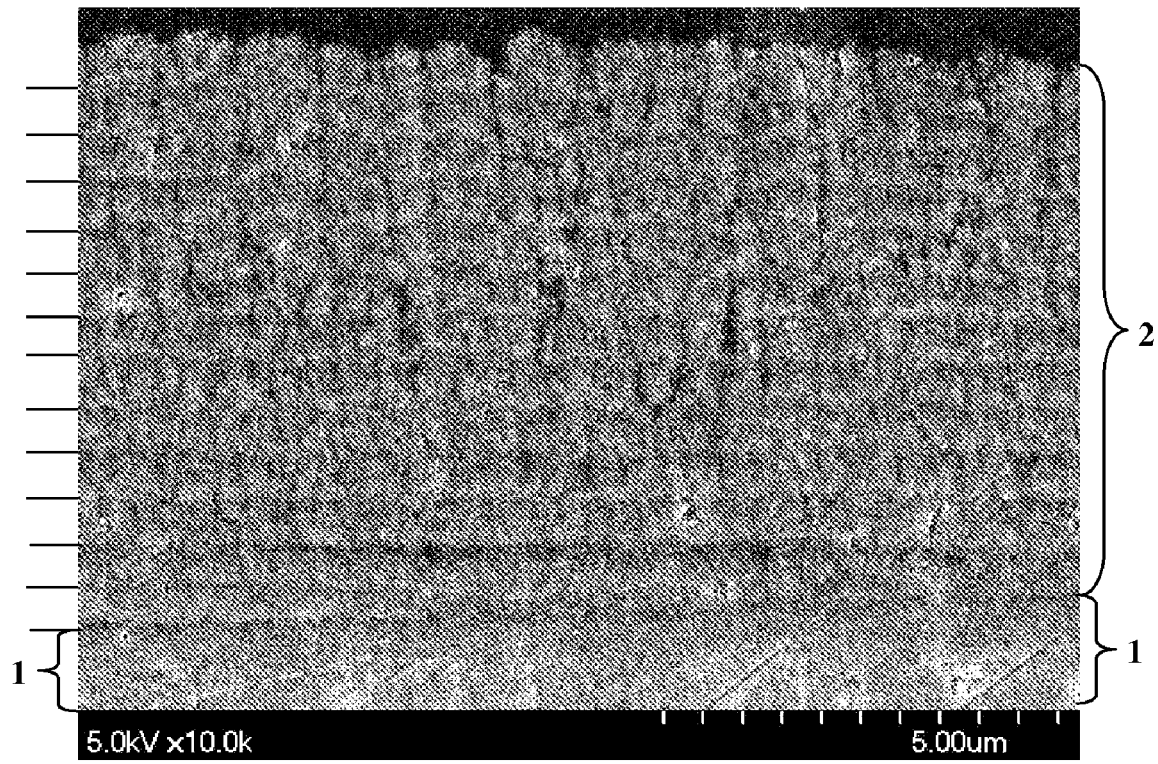
FIG. 1B is a micrograph (cross-sectional view) of 13-strata coating obtained by SEM at magnification 1,000.

Comparison of the micrograph of the multi-strata coating (FIG. 1B) with that of the single-stratum coating (FIG. 1A), shows that the multi-strata coating is more homogeneous in terms of size of the pores and their location within the coating. The single-stratum coating is characterized by relatively large voids, having various shapes, which are located non-uniformly within the coating; these large voids do not contribute essentially to the effective surface area of the coating. By contrast, the multi-strata coating has many smaller, semi-regular voids distributed relatively uniformly within the coating; as a result, the effective surface area of the latter coating is higher, as is the capacitance of such foils tested as electrodes.

Figure 2A:
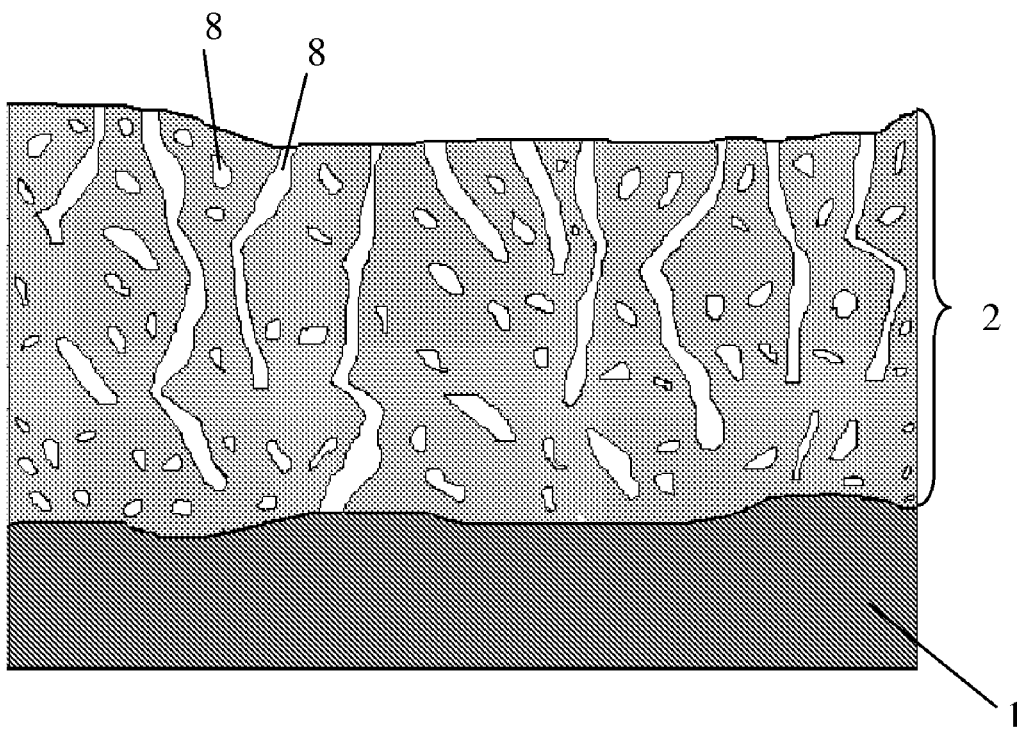
FIG. 2A is a schematic cross-section of a single-strata coating.
Figure 2B:
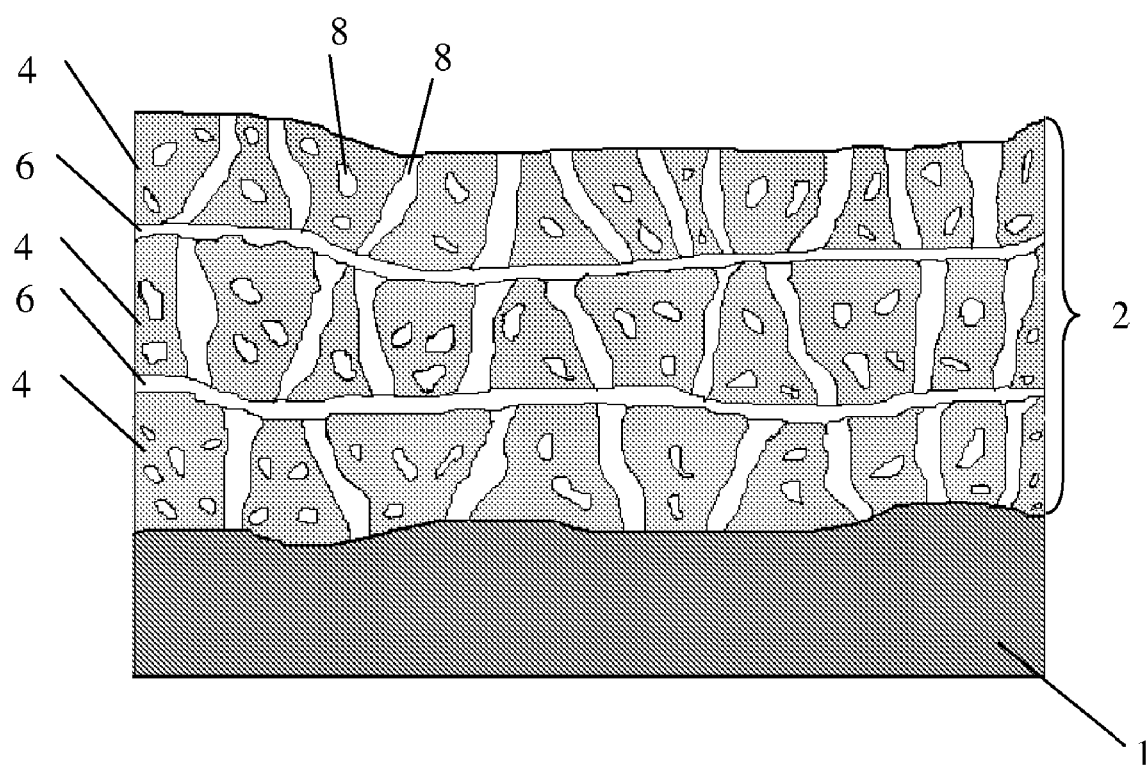
FIG. 2B is a schematic cross-section of a multi (three)-strata coating.

The structure described in the preceding paragraph may be seem more readily in the cross-sectional schematic drawings where FIG. 2A shows a single stratum coating 2 deposited on substrate 1, while FIG. 2B shows a coating 2 containing illustratively, three strata 4, separated by interfaces 6, deposited on substrate 1. As indicated above, the single-stratum coating (FIG. 2A) is characterized by relatively large pores 8 having various shapes, which are located non-uniformly within the coating and do not contribute much to the effective surface area of the coating, whereas the multi-strata coating has many smaller, semi-regular, relatively uniformly distributed channel-like pores 8, which effectively connect the opposite surfaces in each stratum and thus connect also to interfaces 6.

As can be seen from the above TABLE the multi-strata coated foils exhibit a higher capacitance to thickness ratio compared to that of single-stratum coated foils, namely, the capacitance-to-thickness increase is 20% for 13-stratum coating and about 38% for 25-stratum coating.

While the present invention has been particularly described with reference to certain embodiments, it will be apparent to those skilled in the art that many modifications and variations may be made. The invention is accordingly not to be construed as limited in any way by such embodiments, rather its concept is to be understood according to the spirit and scope of the claims.

The invention claimed is:

1. An article of manufacture which includes:
(A) a substrate; and
(B) on at least one surface of said substrate, a porous coating which has a total thickness in the range of up to about 50 microns and which is comprised of a plurality of at least three vacuum-deposited discrete adjacent strata, wherein each discrete stratum is porous, inclusive of porous interfaces, and contains, substantially throughout its breadth, elongate pores forming channels connecting two opposite faces of said strata, whereby a porosity of said coating extends substantially throughout its breadth and depth, and is fabricated from at least one substance selected from the group consisting of metals and metal oxides.

2. An article of manufacture according to claim 1, which is further characterized by at least one of the following features:
(a) said substrate is a metal substrate; and
(b) said metals are valve metals and said metal oxides are valve metal oxides.

3. An article of manufacture according to claim 2, which is further characterized by at least one of the following features:
said metal substrate is selected from the group consisting of aluminum and aluminum alloy substrates, and said valve metal is aluminum;
said metal substrate is a metal foil substrate;
said article of manufacture is selected from an electrode adapted for use in capacitors, a membrane, and a precursor for a lithographic printing plate.

4. An article of manufacture according to claim 3, wherein said substrate is a metal foil substrate and said coating is disposed on the surface of one side only of said foil substrate.

5. An article of manufacture according claim 3, wherein said substrate is a metal foil substrate and said coating is disposed on the surfaces of both sides of said foil substrate.

6. An article of manufacture according to claim 2, wherein said substrate is a metal foil substrate and said coating is disposed on the surface of one side only of said foil substrate.

7. An article of manufacture according claim 2, wherein said substrate is a metal foil substrate and said coating is disposed on the surfaces of both sides of said foil substrate.

8. An article of manufacture according to claim 1, wherein said substrate is a metal foil substrate and said coating is disposed on the surface of one side only of said foil substrate.

9. An article of manufacture according claim 1, wherein said substrate is a metal foil substrate and said coating is disposed on the surfaces of both sides of said foil substrate.

10. An article of manufacture according to claim 1, which is selected from an electrode adapted for use in capacitors, a membrane, and a precursor for a lithographic printing plate.

11. The article of claim 1, on which has been superimposed by anodization a surface oxide layer.

* * * * *